(12) United States Patent
Liu et al.

(10) Patent No.: US 8,736,170 B1
(45) Date of Patent: May 27, 2014

(54) STABLE COLD FIELD EMISSION ELECTRON SOURCE

(75) Inventors: Kun Liu, Portland, OR (US); Gregory A. Schwind, Portland, OR (US)

(73) Assignee: FEI Company, Hillsboro, OR (US)

( * ) Notice: Subject to any disclaimer, the term of this patent is extended or adjusted under 35 U.S.C. 154(b) by 530 days.

(21) Appl. No.: 13/032,488

(22) Filed: Feb. 22, 2011

(51) Int. Cl.
*H01J 25/50* (2006.01)
*H01J 23/06* (2006.01)

(52) U.S. Cl.
CPC ..................................... *H01J 23/06* (2013.01)
USPC ............... 315/39.57; 315/111.81; 315/111.31

(58) Field of Classification Search
CPC ... H01J 9/025; H01J 1/30; H01J 2237/06341; H01J 23/06; H01J 37/073; H01J 3/021
USPC .......... 315/111.81, 507, 39.57, 39.59, 111.31
See application file for complete search history.

(56) References Cited

U.S. PATENT DOCUMENTS

| | | | |
|---|---|---|---|
| 3,766,427 A | 10/1973 | Coates et al. | |
| 3,775,630 A | 11/1973 | Minamikawa et al. | |
| 3,817,592 A | 6/1974 | Swanson | |
| 4,019,077 A | 4/1977 | Sakitani | |
| 4,631,448 A * | 12/1986 | Tamura et al. | 315/111.81 |
| 4,695,773 A * | 9/1987 | Veneklasen et al. | 315/382 |
| 4,954,711 A | 9/1990 | Fink et al. | |
| 5,449,968 A | 9/1995 | Terui et al. | |
| 6,680,562 B1 | 1/2004 | McGinn et al. | |
| 6,771,013 B2 | 8/2004 | Magera et al. | |
| 6,798,126 B2 | 9/2004 | Schwind et al. | |
| 7,064,477 B2 | 6/2006 | Magera et al. | |
| 7,544,523 B2 | 6/2009 | Schwind et al. | |
| 7,633,074 B2 | 12/2009 | Frosien | |
| 7,888,654 B2 | 2/2011 | Tessner, II et al. | |
| 2011/0018470 A1 | 1/2011 | Zhang et al. | |
| 2012/0085925 A1 | 4/2012 | Kasuya et al. | |

FOREIGN PATENT DOCUMENTS

| | | |
|---|---|---|
| GB | 1477458 | 6/1977 |
| JP | 56061733 | 5/1981 |
| JP | S63 259948 | 10/1988 |
| JP | H01 248446 | 10/1989 |
| WO | 2010146833 | 12/2010 |

OTHER PUBLICATIONS

Lepage, et al., "Oxidation and Faceting of Polycrystalline Tungsten Ribbons", Surface Science, Oct. 1, 1985, pp. 255-277, vol. 161, Issue 1.

(Continued)

*Primary Examiner* — Douglas W Owens
*Assistant Examiner* — Jianzi Chen
(74) *Attorney, Agent, or Firm* — Scheinberg & Assoc., PC; Michael O. Scheinberg (57) ABSTRACT

A cold field emission (CFE) electron source for a focused electron beam system such as a transmission electron microscope (TEM), scanning transmission electron microscope (STEM), or scanning electron microscope (SEM) is disclosed. The source employs an emitter enclosure electrode behind the CFE tip which, in conjunction with the extractor electrode, defines a closed volume that can be thoroughly cleaned by electron impact desorption (EID) and radiative heating from a heated filament located between the emitter enclosure electrode and extractor electrode. The extractor electrode may have a counterbore which restricts backscattered electrons generated at the extractor from reaching portions of the source and gun which have not been cleaned by EID. Pre-cleaning of the emitter enclosure electrode and extractor electrode prior to cold field emission substantially improves both source emission stability and frequency noise characteristics, enabling source operation over time intervals adequate for application to TEMs, STEMs, and SEMs.

18 Claims, 10 Drawing Sheets

(56) References Cited

OTHER PUBLICATIONS

Lo, et al., "Titanium Nitride Coated Tungsten Cold Field Emission Sources," J. Vac. Sci. Technol. B, Nov./Dec. 1996, pp. 3787-3791, vol. 14, Iss. 6.

Melmed, A.J., "The Art and Science and other aspects of making sharp tips," Journal of Vacuum Science & Technology B: Microelectronics and Nanometer Structures, Mar./Apr. 1991, pp. 601-608, vol. 9, Issue 2.

Wengelnik et al., "Oxygen-Induced Sharpening Process of W(111) Tips for Scanning Tunneling Microscope Use", Journal of Vacuum Science and Technology, A, Jan./Feb. 1990, pp. 438-440, vol. 8, Iss. 1.

\* cited by examiner

STABLE COLD FIELD EMISSION ELECTRON SOURCE

TECHNICAL FIELD OF THE INVENTION

The present invention relates generally to electron sources, and more particularly to cold field emission electron sources for application in focused electron beam systems.

BACKGROUND OF THE INVENTION

In focused electron beam systems a column is typically used to focus an electron beam onto the surface of a target to be imaged and (optionally) processed using the beam. In these columns, an electron source generates the initial beam of electrons, which then passes into an electron "gun", which typically focuses the charged particles into a roughly parallel beam which enters the main body of the column. Various types of electron sources have been used in focused electron beam systems, including thermionic cathodes, Schottky emitters, and cold field emitters (CFEs). Of these, CFEs are characterized by the highest brightnesses and smallest energy spreads, potentially enabling the smallest beam sizes at the target, with the highest current densities, thus enabling improved imaging resolution. Unfortunately, CFE sources have also shown a tendency for very fast (~0.5 to 1.5 hours) quenching of the emission current even in excellent UHV (~$10^{-10}$ Torr) conditions. In an attempt to solve or ameliorate this problem, FEI Company, Hillsboro, Oreg., developed and patented (U.S. Pat. No. 7,888,654, to Tessner II et al. for "Cold Field Emitter") an oxidized W(111) CFE that demonstrates much slower quenching than previous (unoxidized tip) CFE sources. These improved CFE sources, however, still demonstrate noise in the emission current after a short period of source operation. Thus, there is a need for a CFE source with improved emission stability while demonstrating reduced noise.

SUMMARY OF THE INVENTION

An object of the invention is to provide a cold field emitter (CFE) electron source having improved emission stability and reduced noise.

In some embodiments of the invention, a filament positioned between an emitter enclosure electrode and an extractor electrode is used to clean surfaces near the emitter tip. In some embodiments, the gap between the emitter enclosure electrode and the extractor electrode is configured to limit the paths of backscattered electrons and/or to reduce the influx of gas molecules into the region of the tip. Embodiments of the invention have been shown to significantly improve stability and reduce the noise of CFEs.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the present invention provide a cold field emitter (CFE) electron source having improved emission stability and reduced noise. Embodiments provide source structures that are thought to greatly reduce levels of ion and neutral molecule bombardment of the emitter tip during normal cold field emission operation of the CFE source, while also reducing the rate of accumulation of adsorbates on surfaces impacted by the electron beam. In some embodiments, this is accomplished by enclosing the emitter tip between an emitter enclosure electrode and the extractor, and then thoroughly cleaning both inner surfaces by a combination of electron bombardment and radiative heating. This cleaning process utilizes a thermionic filament capable of electron bombarding the inner surfaces of the emitter enclosure electrode and extractor, and also radiantly heating these surfaces—both the electron bombardment and heating serve to remove essentially all adsorbates from these surfaces prior to the initiation of CFE emission to generate an electron beam. The thermionic filament may be annular and centered on the emission axis, or may be of any shape and in any position or orientation such that the emissions and/or radiation from the filament are sufficiently distributed onto the surfaces of the emitter enclosure electrode and extractor to adequately clean the surfaces.

In some embodiments, a confining structure, such as a counterbore or countersink structure in the side of the extractor facing the emitter tip, serves to confine backscattered electrons (BSEs) generated by impact of the CFE electrons with the emitter, preventing these BSEs from striking surfaces within the electron gun which may have desorbable gas layers. Studies have shown that the causes of tip emission instabilities are variations in the local work function and electric field due to contamination by adsorbates and by geometrical modifications of the tip shape due to ion bombardment. The discussion below considers the origins of these effects.

First, we discuss prior art measurements of CFE emission stability and noise, including an analysis of the origins of the observed emission instability. Quantitative measurements of noise and emission quenching are presented in order to put the experimentally demonstrated benefits of the present invention in context. Prior art attempts at reducing noise and improving stability are then discussed, including the causes for the failure of these attempts to fully solve the noise and stability problems with CFE sources. Finally, the source structure of the present invention is presented and its operation in both the degassing and CFE operating modes described.

Measurements of Emission Current Stability for Prior Art CFE Sources

Figure 1:
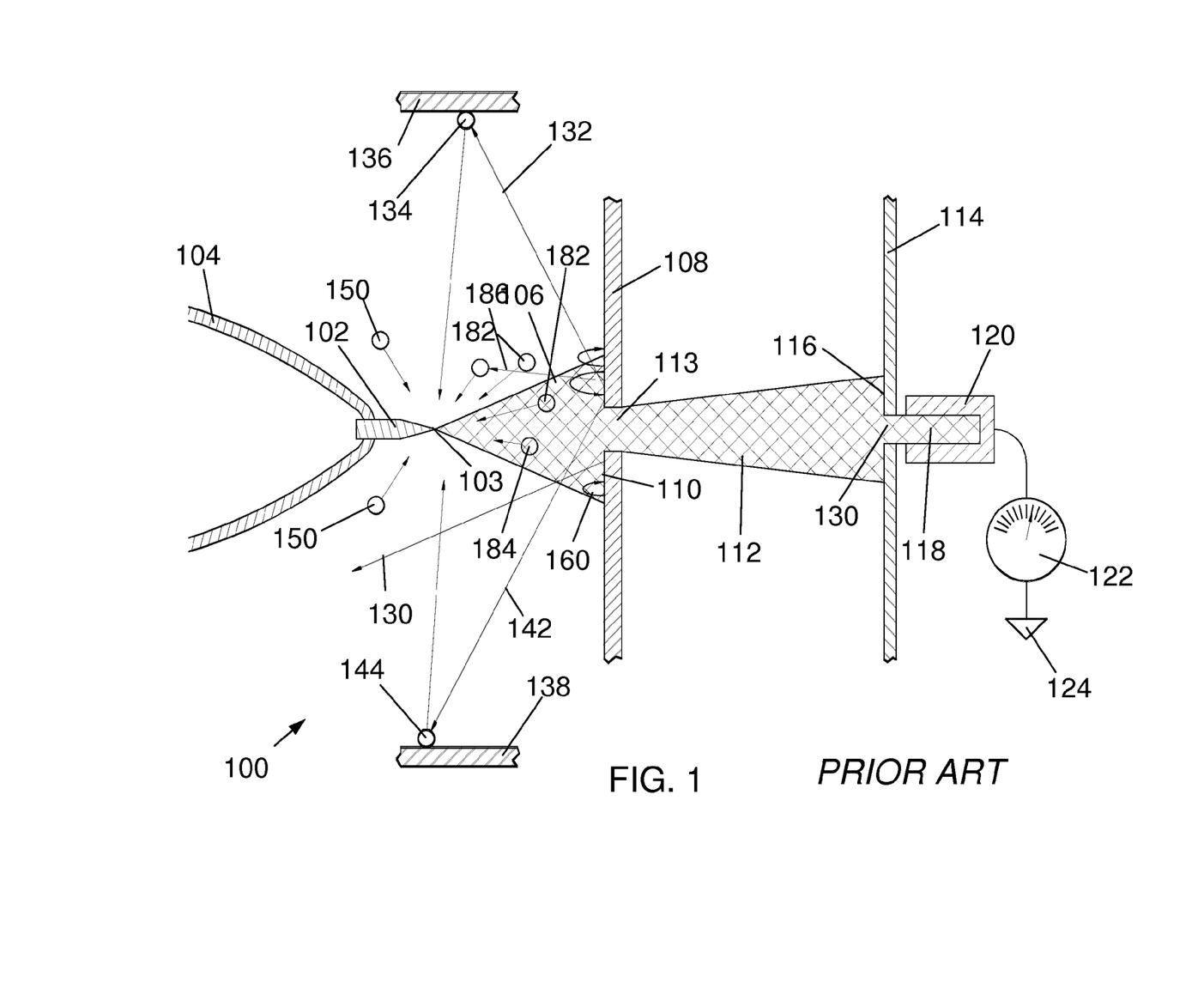
FIG. 1 is a schematic diagram of a prior art cold field emitter electron source in a test set-up for measuring the on-axis emission current stability.

FIG. 1 is a schematic diagram 100 of a cold field emitter (CFE) electron source in a test set-up for measuring the on-axis emission current stability. A number of physical effects occur at, and in the proximity of, the CFE emitter tip 103 which may have a deleterious influence on the stability and noise levels of the source in a focused electron beam system such as a scanning electron microscope (SEM), transmission electron microscope (TEM), or scanning transmission electron microscope (STEM). In a typical CFE source, electrons are emitted from the sharp end 103 of an oriented wire 102 which is welded to a support filament 104. A bias voltage is applied between the emitter tip 103 and an extractor electrode 108, which creates a very high electric field at the surface of the tip 103, thereby inducing tunneling of electrons out of the tip 103 into the vacuum in front of the tip. These emitted electrons form a beam 106 which is directed toward the right of FIG. 1. The great majority of the electrons in beam 106 strike the extractor 108 at area 110, while a small portion of the center of the emission distribution passes through hole 113 in extractor 108 to form beam 112. The test set-up for measuring the emission stability comprises a shield plate 114, and a Faraday cup 120 electrically connected to an electrometer 122. The majority of beam 112 strikes the shield plate 114 at area 116, while a small portion 118 from the center of the emission distribution passes through the hole 130 in shield plate 114 and is collected by the Faraday cup 120. This collected current is measured by electrometer 122 and then passes to the system ground 124. Since, in a typical focused electron beam system, only a very small portion of the center of the emission distribution from the tip 103 contributes to the final beam current at the sample, the test system illustrated here is configured to measure that center portion, while excluding other portions of the emission distribution which would be apertured away (i.e., blocked from passing to the sample) in an actual application.

The impact of beam 106 with the extractor 108 at area 110 induces the emission of secondary electrons (SEs) 160. Although the voltage difference between the tip 103 and the extractor 108 mostly creates an electric field in the proximity of the tip 103, enough residual electric field remains near area 110 that secondary electrons 160 (which have low energy) are attracted back to the extractor 108, as shown by the curved trajectories in FIG. 1. The impact of beam 106 with the extractor at area 110 also induces backscattered electron (BSE) emission 130—the majority of the BSEs have nearly the same energy as the impacting electrons from beam 106, thus the small electric field at area 110 cannot prevent the escape of BSEs 130 into the overall volume of the electron gun, as shown. Some BSEs 130 travel to regions of the gun far enough away from tip 103 to cause no obvious effects on source operation. BSE 132 can be seen striking surface 136, desorbing a gas molecule 134 which may travel towards the emitter tip 103, potentially inducing sputter damage to the structure of tip 103 or adsorbing onto tip 103. On the other side of tip 103, BSE 142 desorbs and ionizes molecule 144 from surface 138 to travel towards the tip 103—due to the negative bias voltage on tip 103, ion 144 will be accelerated towards tip 103, potentially causing sputter damage to the local tip structure near the point of impact of ion 144 with tip 103. Note that surfaces 136 and 138 represent any surfaces within the electron gun which are not cleaned (i.e., from which adsorbed molecules have not been desorbed) prior to initiation of cold field emission from tip 103—surfaces 136 and 138 are shown closer to tip 103 than would generally be the case in an actual source. In the prior art, it has been found to be difficult to find means for completely cleaning all surfaces within electron guns which may be exposed to BSEs. Polarizable gas molecules 150 may be attracted to, and adsorbed onto, the tip 103 by the local electric field gradient, changing the work function and thus causing variations in the emission currents. The impact of beam 106 with the extractor 108 can also desorb gas molecules 182 from area 110 of extractor 108—these molecules 182 may subsequently adsorb on the emitter tip 103, usually increasing the local work function and thus reducing the cold field emission current. Gas molecule 184 is ionized by an electron 186 from beam 106 and is then attracted to the negatively-biased tip 103, as was the case for ion 144. In some cases, sputtering damage to the tip 103 may create locally very sharp regions which will demonstrate increased field emission—this effect may cause a catastrophic momentary increase in the emission current, possibly leading to arcing and subsequent destruction of the emitter tip 103.

Figure 2:
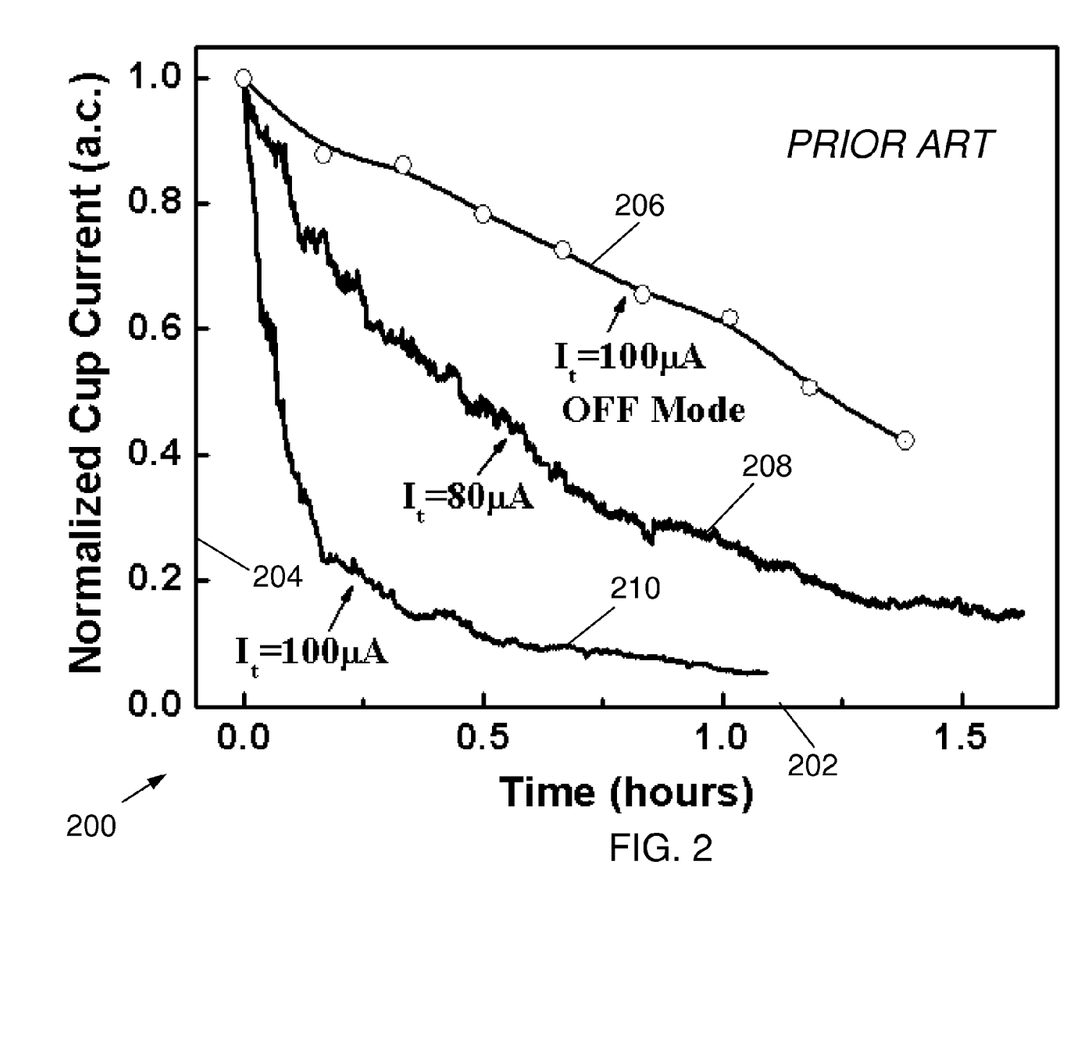
FIG. 2 is a graph of experimental results for a prior art cold field emitter source, demonstrating the quenching of emission.

FIG. 2 is a graph 200 of experimental results for a prior art cold field emitter source, demonstrating the quenching of emission as observed with the CFE source and test set up illustrated in FIG. 1 as a function of time 202. The normalized current plotted along axis 204 represents the output from electrometer 122 in FIG. 1—note that for curves 206, 208 and 210, the value "1.0" on axis 204 represents the initial collected current, which may differ in absolute value between the curves 206, 208 and 210, respectively. Three different experiments are compared here: 1) curve 206 represents a series of Faraday cup current readings taken over a period of nearly 1.5 hours, where the source was off between measurements (indicated by the circles) and the total initial emission current was 100 µA, 2) curve 208 represents continuous operation of a source with an initial total emission current of 80 µA, while 3) curve 210 represents continuous operation of a source with an initial total emission current of 100 µA. Several significant conclusions can be drawn from comparison of curves 206, 208 and 210:

1) In all three cases, the normalized Faraday cup current drops significantly over less than 1.5 hours—this time-frame is too short for the CFE source to have practical application in a typical focused electron beam system.

2) For the OFF mode case (curve 206), the rate of drop is less—this indicates that some of the current drop-off must be beam-induced, such as the bombardment of tip 103 by ions 144 and 184 illustrated in FIG. 1.

3) For both ON modes (curves 208 and 210), the rate of drop-off is higher than for the OFF mode curve 206.

4) For higher total initial tip emission (i.e., 100 μA in curve 210 compared with 80 μA for curve 208), the collected current drop-off is faster since for larger total emission currents the rates of local gas desorption and ion bombardment are increased—confirming that beam induced processes contribute to the current drop off. Especially for the 100 μA curve 210, the rate of drop-off is catastrophic—within 0.25 hours (15 minutes), the normalized Faraday cup current has dropped by roughly 80%.

Figure 3:
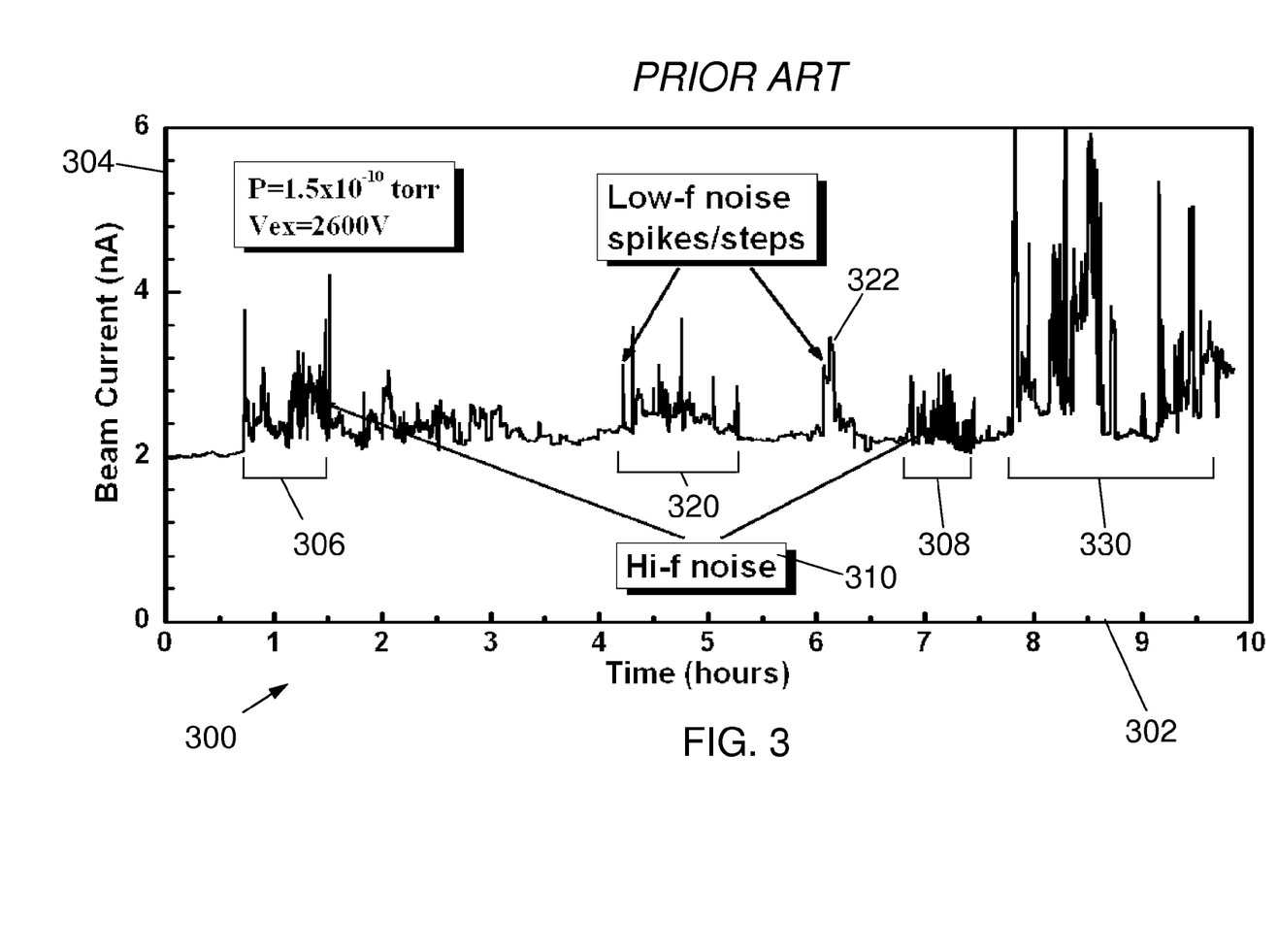
FIG. 3 is a graph of experimental results for a prior art cold field emitter source, demonstrating undesirable emission instability.

FIG. 3 is a graph 300 of experimental results for a prior art cold field emitter (CFE) source such as in FIG. 1, demonstrating unacceptable levels of noise. The beam current (in nA) 304 is plotted as a function of time 302 for nearly a 10 hour span. Even near the beginning of the run, the source demonstrates noise 306 which begins abruptly at around 0.75 hours and starts decreasing near 1.5 hours, tailing off to around 3.0 hours into the run—this is characteristic of prior art emitters and is believed to arise at least partially from the fact that the physical area on the emitter tip 103 which contributes to the final beam current (i.e., the current 118 into Faraday cup 120 in FIG. 1) is near atomic dimensions in size, thus even a single adsorbate molecule may have a significant effect on the local work function leading to rapid, oscillatory current fluctuations as seen here which are thought to arise from rapid motions of these adsorbates into, and out of, the relevant region on the tip 103. Rapid motions of atoms in the tip itself are also believed to contribute to these fluctuations. The burst of noise 308 near 7.0 hours also demonstrates this abrupt turn-on and turn-off behavior.

Noise is also apparent during time-period 320, from 4.2-5.3 hours, and again during time-period 322, at around 6.25 hours—although at lower frequency than for time-periods 306 and 308, this lower-f noise is also unacceptable in a focused electron beam system. Finally, at the far right, time frame 330 after around 7.9 hours demonstrates even wilder emission current fluctuations, which may precede the failure of the emitter tip due to vacuum high voltage breakdown (arcing).

Prior Art Attempts to Improve the Emission Current Stability

Figure 4:
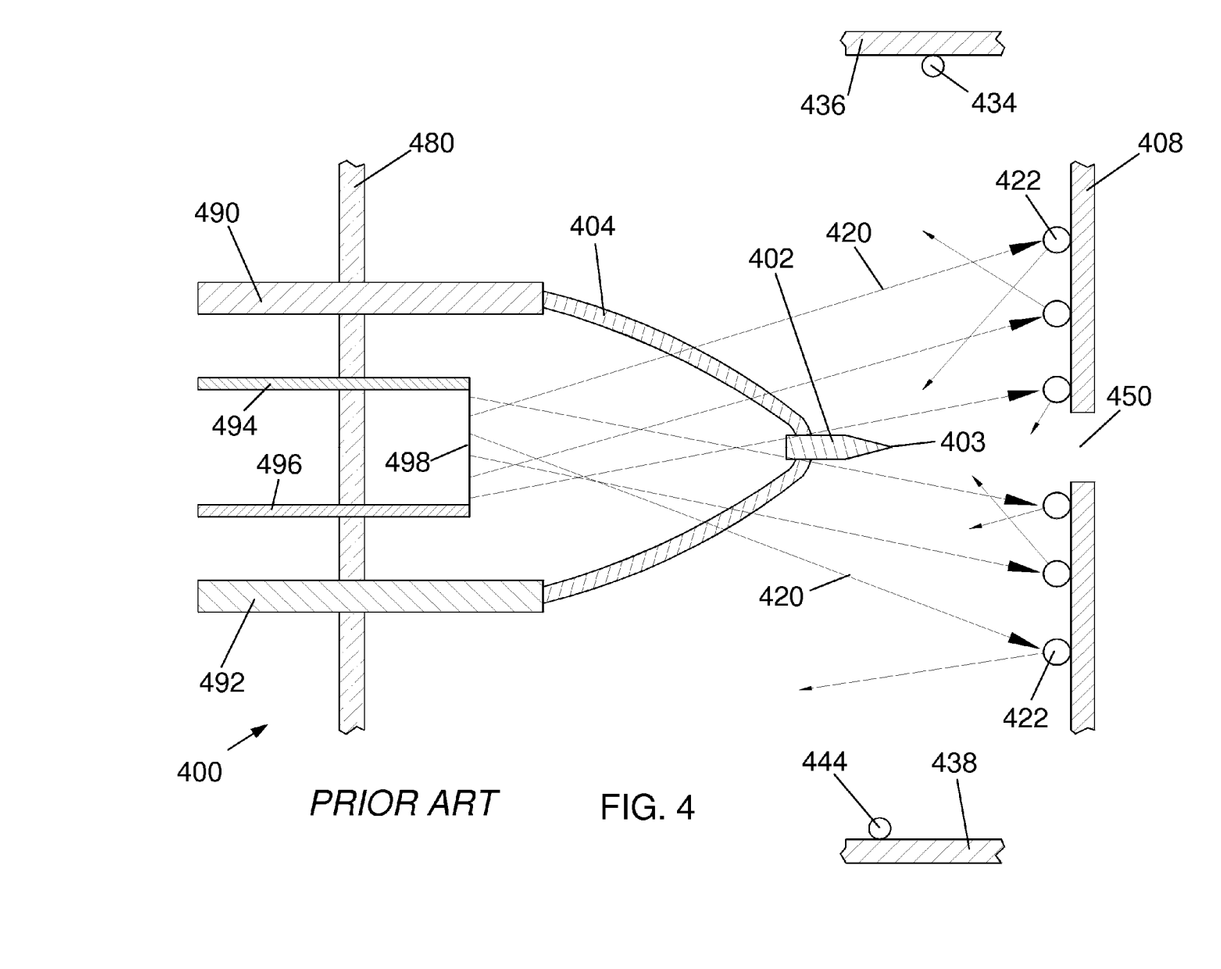
FIG. 4 is a schematic diagram of a prior art cold field emitter electron source with an outgassing filament in the source base.

FIG. 4 is a schematic diagram 400 of a prior art cold field emitter electron source with an outgassing filament in the source base. The CFE emitter tip 403 comprises the sharpened end of an oriented wire 402, typically spot-welded to a filament 404 which is, in-turn, welded to two mounting posts 490 and 492 which are attached to an insulating structure such as disk 480, shown in cutaway. A filament 498 is mounted between posts 494 and 496 and a voltage is applied between posts 494 and 496 to induce ohmic heating of filament 498. A bias voltage is applied between filament 498 and the extractor 408—this bias voltage serves to attract the electrons 420 which are emitted thermionically from filament 498 toward the extractor 408. Impact of electrons 420 with adsorbed molecules 422 on extractor 408 causes electron induced desorption (EID). With sufficient numbers of electrons 420, the great majority of the adsorbed molecules 422 can be removed. Unfortunately, in the prior art, other surfaces 436 and 438 (shown closer to tip 403 than would generally be the case in an actual source) within typical gun structures were found to receive an inadequate flux of bombarding electrons 420 and thus retained a portion of their original coating of adsorbates, such as 434 and 444, respectively. The deleterious effects of these adsorbates 434 and 444 on normal source operation were discussed in FIG. 1. Thus, a fundamental problem with prior art methods for in situ cleaning of the electron source and gun was an inability to adequately remove adsorbates from surfaces within the gun which are subsequently impacted by backscattered electrons emitted from the extractor due to impact of the primary electron beam from the emitter tip. In prior art CFE source and gun designs, the pumping speed between the region surrounding the emitter tip and the overall gun structure was made as large as possible to allow ambient gas to flow away from the tip—however this clearly also allows gas to flow towards the tip.

CFE Electron Source Design of an Embodiment of the Invention

Figure 5:
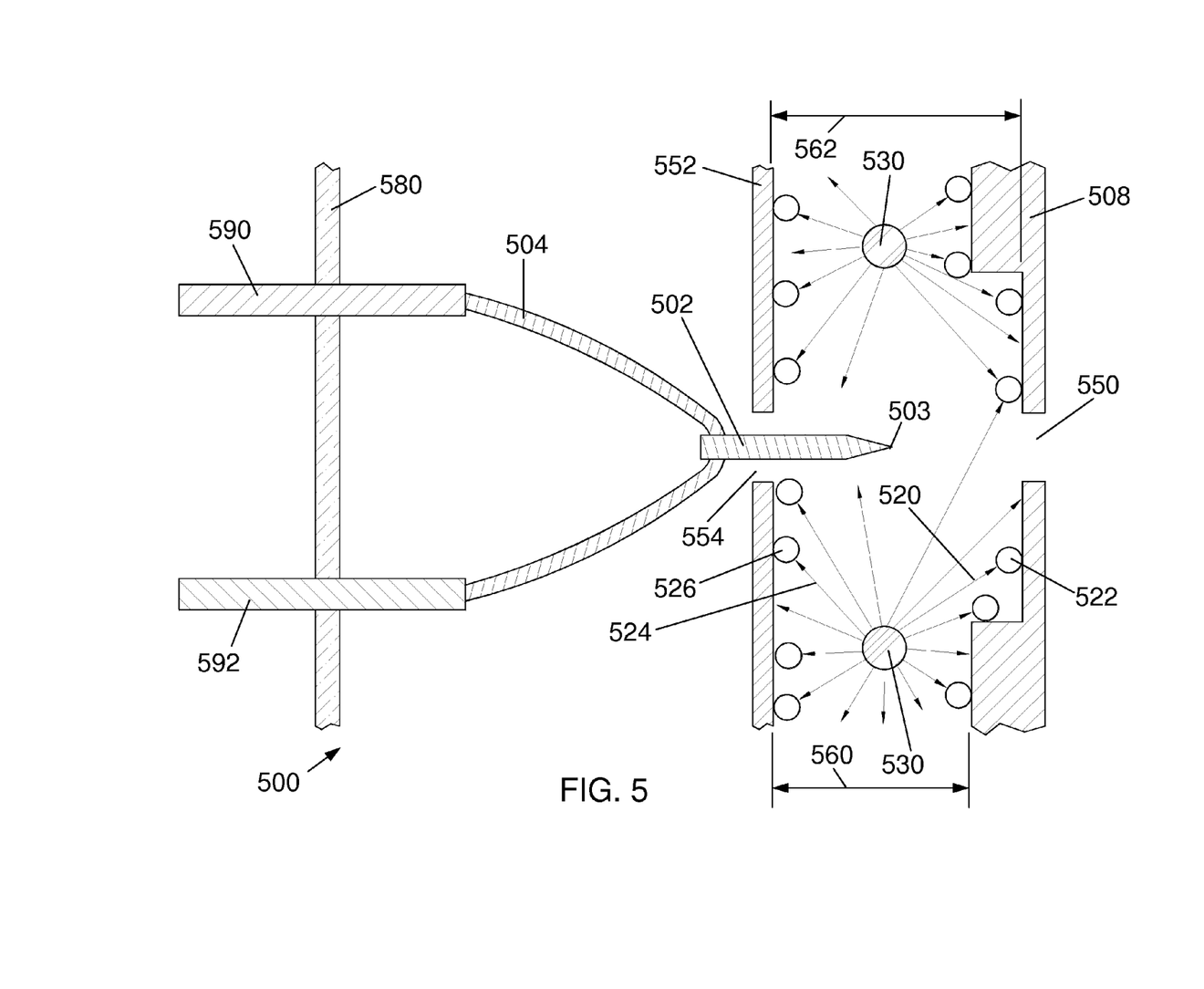
FIG. 5 is a schematic diagram of a cold field emitter electron source of the present invention, operating in the degassing mode.

FIG. 5 is a schematic diagram 500 of an embodiment of a cold field emitter electron source of the present invention, operating in the degassing mode. The CFE emitter tip 503 is the sharpened end of the tip wire 502, typically an oriented wire of a refractory metal such as tungsten. The tip wire 502 may be spot-welded to a filament 504, supported by posts 590 and 592 mounted in an insulating disk 580. To clean just the emitter wire 502 and tip 503, a current can be "flashed" through filament 504 by applying a voltage between posts 590 and 592, thereby momentarily ohmically heating filament 504, wire 502, and tip 503 hot enough to remove adsorbates, restoring the initial clean tip structure characterized by the work function of the base metal of the oriented tip wire 502, or of the oxidized W(111) surface of the wire 502 and tip 503 as described in U.S. Pat. No. 7,888,654, issued 15 Feb. 2011. Although this tip flashing process is effective in cleaning the wire 502 and tip 503, it does not remove adsorbates from the extractor 508 or other surfaces within the gun which may be impacted by BSEs from the extractor, as shown in FIG. 1. Thus, a more thorough source and gun cleaning method is preferred, capable of more complete removal of adsorbates than the prior art illustrated in FIG. 4. In the present invention, an emitter enclosure electrode 552 with a hole 554 through which the tip wire 502 protrudes (typically by ~1.5 mm) is mounted as shown. The distance from the tip 503 to the extractor 508 is typically ~0.75 mm. In addition, a circular filament 530 is located radially outwards from the tip wire 502 and between the emitter enclosure electrode 552 and the extractor 508. Three different cleaning modes using filament 530 are possible:

1) Pure EID desorption—in this mode, the inner surfaces of the emitter enclosure electrode 552 and extractor 508 are cleaned using bombardment by electrons 520 and 524 emitted from the filament 530 due to a voltage applied between the filament 530 (which is heated by an electric current) and the emitter enclosure electrode 552 and extractor 508—this induces thermionic emission of electrons 520. Adsorbate molecules 522 and 526 are then desorbed and pumped-away. Typical gaps between the facing surfaces of the emitter enclosure electrode 552 and the extractor 508 may range from 1.8 to 2.2 mm—this allows adequate radial pumping speeds for removal of the desorbed gas molecules.

2) Pure Thermal Desorption—in this mode, the filament 530 is still heated, but a bias voltage need not be applied between the filament 530 and either the emitter enclosure electrode 552 or the extractor 508—adsorbates 522 and 526 are then removed by thermal excitation of the surfaces and molecules. Pumping of desorbates is the same as for the first mode, above. Within a short time, temperatures exceeding 400° C. may be reached on the emitter enclosure electrode 552 and extractor 508, effectively removing adsorbed molecules.

3) Combined EID and Thermal Desorption—in this mode, adsorbates 522 and 526 are removed both by impact of thermionic electrons 520 and 524 from the filament 530 and by heating due to radiation from the heated filament 530.

A gap 560 is formed between emitter enclosure electrode 552 and extractor 508. In some embodiments, the gap 562 is wider near the hole 550 in extractor 508 than farther off-axis from the hole 550, forming a partial enclosure or shield in the region around the emitter tip. The confining space may have a concave shape, that is, thicker near the center than at the edge. For example, FIG. 5 shows the surface of extractor 508 that faces the tip 503 has a shallow depression (~0.45 mm deep), such as a counterbore which, coupled with the narrow gap 560 between the emitter enclosure electrode 552 and the extractor 508 away from the depression, forms a partly enclosed volume around tip 503. During source operation, this partly enclosed volume serves to confine the production of ionized and neutral molecules to the surfaces of the emitter enclosure electrode 552 and extractor 508, while preventing BSEs generated at the bottom of the depression from reaching other surfaces within the gun (such as surfaces 136 and 138 in FIG. 1). Other shapes for emitter enclosure electrode 552 and extractor 508 can accomplish the same purpose. For example, a countersink, counterbore, or curved surface can be incorporated into either the emitter enclosure electrode 552, the extractor 508, or both, to produce a partly enclosed space around the emitter.

Figure 6:
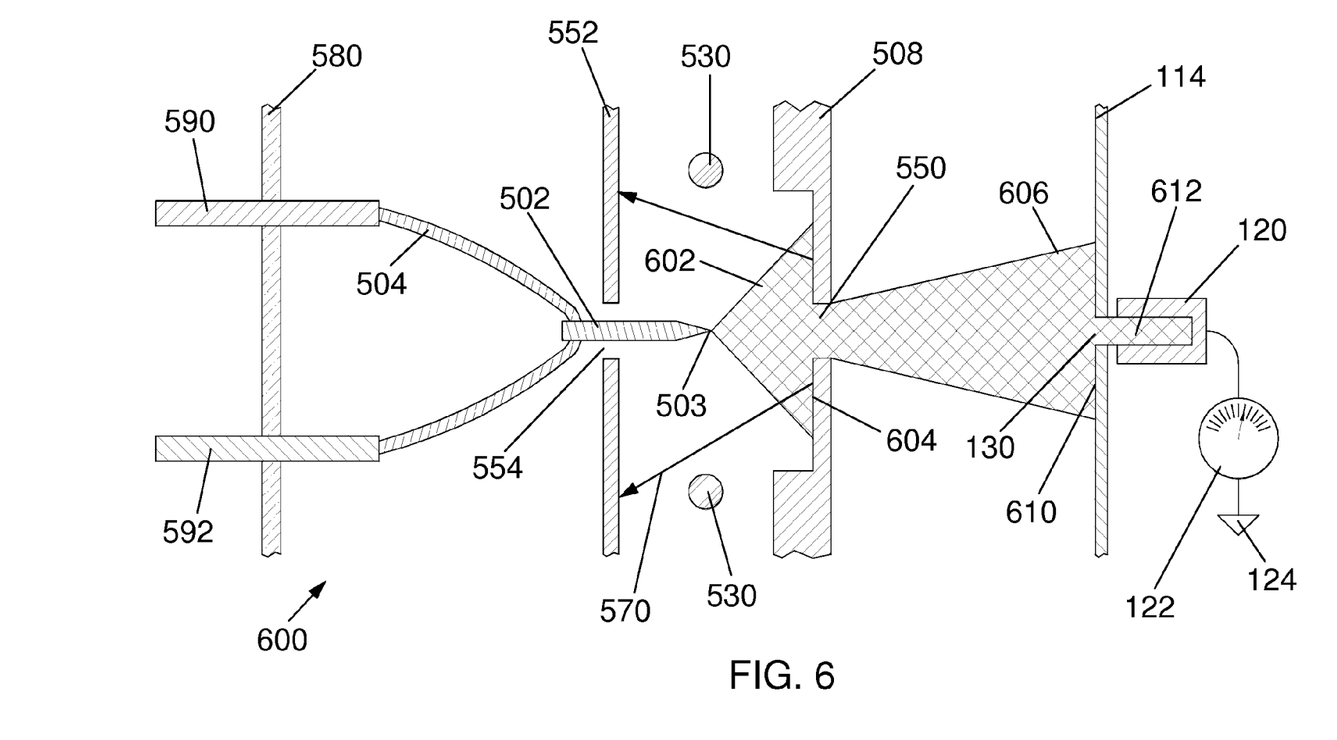
FIG. 6 is a schematic diagram of a cold field emitter electron source of the present invention, operating in the cold field emission mode in a test set-up for measuring the on-axis emission current stability.

FIG. 6 is a schematic diagram 600 of the CFE electron source of FIG. 5, operating in the cold field emission mode in the test set-up for measuring the on-axis emission current stability illustrated in FIG. 1. Comparison of FIG. 6 to FIG. 1 illustrates the advantages of some embodiments of the present invention over prior art CFE sources. The cleaning process shown in FIG. 5 has thoroughly removed adsorbed molecules from all surfaces which are impacted by the beam 602 emitted from tip 503 due to the electric field induced by the voltage applied between the tip 503 and the extractor 508. Thus, the inner surface 604 of extractor 508 is relatively free of adsorbates. BSE emission 630 from surface 604 is confined by the combination of the emitter enclosure electrode 552 and the counterbore in the extractor 508, thus gas desorption from surfaces 436 and 438 (not shown here—see FIG. 1) cannot occur. The current measurement set-up is the same as in FIG. 1—a small portion 606 of beam 602 passes through hole 550 in extractor 508. The majority of the resultant beam 606 strikes the shield plate 114 at area 610, while a small center portion 612 passes through hole 130 to enter the Faraday cup 120. Current collected by the Faraday cup 120 is measured by electrometer 122 and then passes to the system ground 124.

First Embodiment of the Emitter Tip Region

Figure 7:
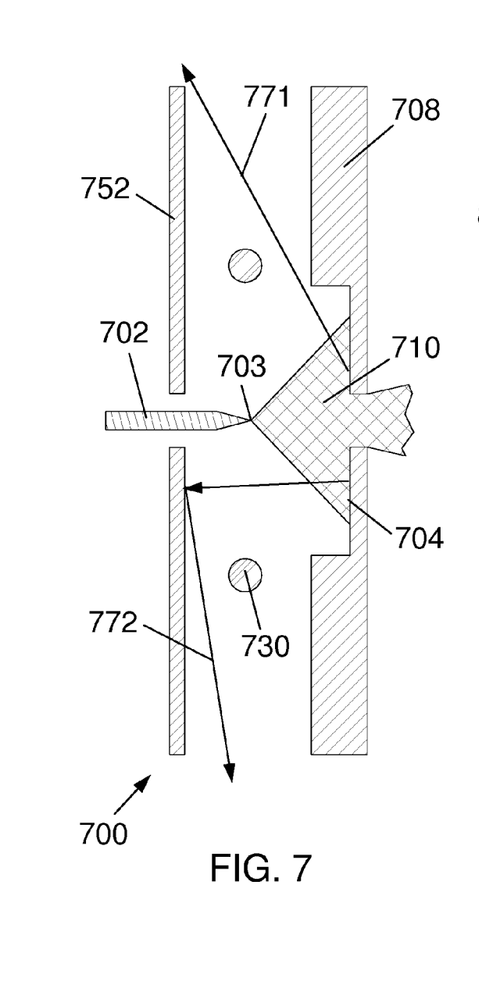
FIG. 7 is a schematic diagram of a portion of a cold field emitter electron source of the present invention, illustrating a first embodiment of the source tip region.

FIG. 7 is a schematic diagram of a portion of a cold field emitter electron source, illustrating a first embodiment 700 of the emitter tip region. The emitter wire 702 has a sharpened end 703 which emits electrons 710 under the influence of a high electric field induced at tip 703 by a high voltage applied between the emitter tip 703 and extractor 708. A volume enclosing tip 703 is formed between the inner surfaces of emitter enclosure electrode (EEE) 752 and extractor 708. A cleaning filament 730 is shown between the EEE 752 and the extractor 708. An important consideration in the design of the source region for this first embodiment is the aspect ratio between the outer radii of EEE 752 and extractor 708, and the gap separating the inner surfaces of EEE 752 and extractor 708. The larger this aspect ratio, the more backscattered electrons generated from the inner surface of extractor 708 are prevented from striking other (possibly unclean) surfaces within the gun, such as surfaces 136 and 138 in FIG. 1. For this first embodiment, the inner surfaces of EEE 752 and extractor 708 are illustrated as flat surfaces near their outer radii—thus a small number of backscattered electrons 771 emitted at large angles from area 704 on extractor 708 may escape from the source tip region. It is also possible for a small number of backscattered electrons 772 reflected at large angles off EEE 752 to also escape from the source tip region.

Second Embodiment of the Emitter Tip Region

Figure 8:
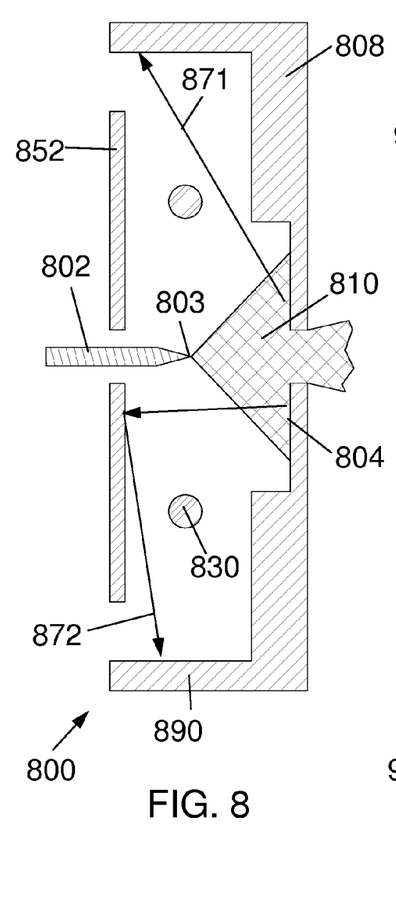
FIG. 8 is a schematic diagram of a portion of a cold field emitter electron source of the present invention, illustrating a second embodiment of the source tip region.

FIG. 8 is a schematic diagram of a portion of a cold field emitter electron source of the present invention, illustrating a second embodiment 800 of the emitter tip region. The emitter wire 802 has a sharpened end 803 which emits electrons 810 under the influence of a high electric field induced at tip 803 by a high voltage applied between the emitter tip 803 and extractor 808. A cleaning filament 830 is shown between the EEE 852 and the extractor 808. A volume enclosing tip 803 is formed between the inner surfaces of emitter enclosure electrode (EEE) 852 and extractor 808. For this embodiment, extractor 808 has an outer shield ring 890, which prevents the escape of backscattered electrons 871 emitted from area 804 on extractor 808, and backscattered electrons 872 reflected off EEE 852, as shown. The benefits of improved BSE containment in this second embodiment must be balanced against a slightly reduced pumping speed from the source tip region. An additional benefit of this second embodiment is that the outer radii of EEE 852 and extractor 808 may be smaller since the aspect ratio considerations for the first embodiment 700 are less important here due to the outer shield ring 890.

Third Embodiment of the Emitter Tip Region

Figure 9:
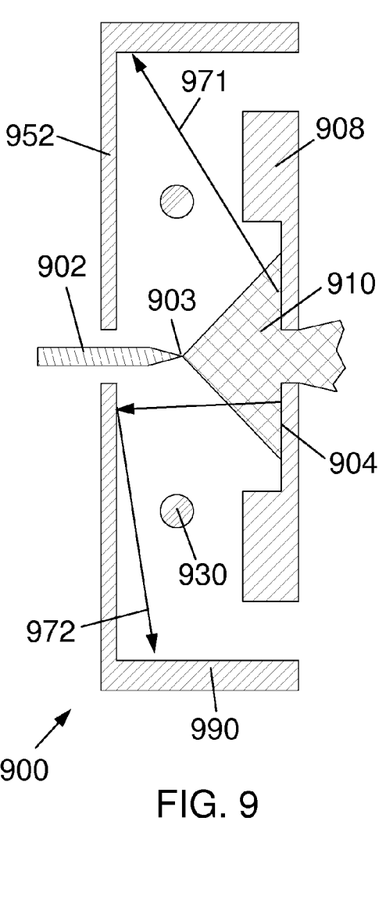
FIG. 9 is a schematic diagram of a portion of a cold field emitter electron source of the present invention, illustrating a third embodiment of the source tip region.

FIG. 9 is a schematic diagram of a portion of a cold field emitter electron source of the present invention, illustrating a third embodiment 900 of the emitter tip region. The emitter wire 902 has a sharpened end 903 which emits electrons 910 under the influence of a high electric field induced at tip 903 by a high voltage applied between the emitter tip 903 and extractor 908. A cleaning filament 930 is shown between the EEE 952 and the extractor 908. A volume enclosing tip 903 is formed between the inner surfaces of emitter enclosure electrode (EEE) 952 and extractor 908. For this embodiment, EEE 952 has an outer shield ring 990, which prevents the escape of backscattered electrons 971 emitted from area 904 on extractor 908, and backscattered electrons 972 reflected off EEE 952, as shown. The benefits of improved BSE containment in this third embodiment must be balanced against a slightly reduced pumping speed from the source tip region. An additional benefit of this third embodiment is that the outer radii of EEE 952 and extractor 908 may be smaller since the aspect ratio considerations for the first embodiment 700 are less important here due to the outer shield ring 990.

Experimental Results for Operation of the CFE Electron Source of the Invention

Figure 10:
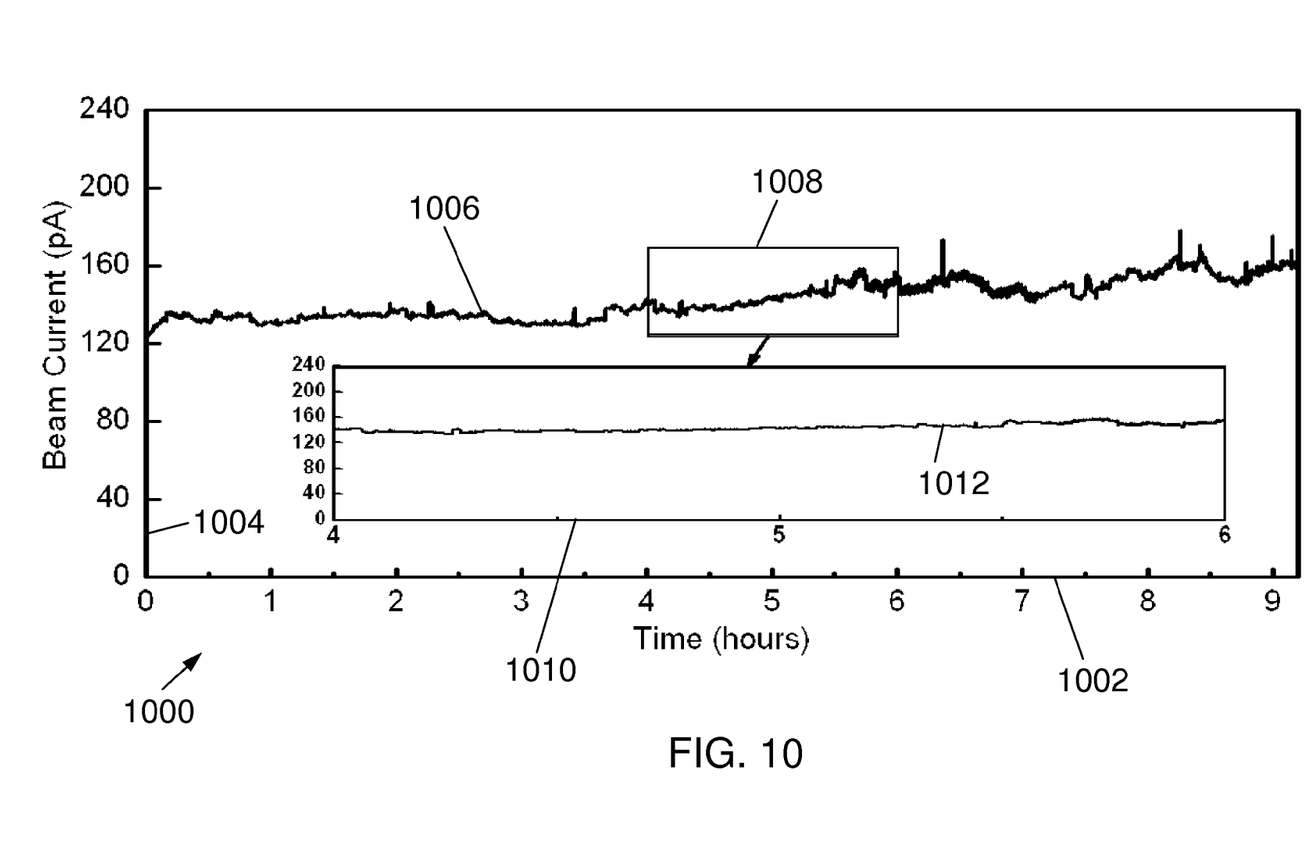
FIG. 10 is a graph of experimental results for the cold field emitter electron source of the present invention.

FIG. 10 is a graph 1000 of experimental results for the cold field emitter electron source embodying aspects of the present invention. The beam current collected on the Faraday cup 120 (see FIG. 1) is plotted on axis 1004 as a function of time (in hours) 1002, extending to slightly past 9 hours of source operation. Curve 1006 can be compared with the data in FIG. 3—a substantial reduction in noise is apparent, especially for the first 5 hours of operation. Box 1008 is expanded as inset 1010 showing curve 1012 as a portion of curve 1006 to highlight this reduction over an expanded time scale from 4 to 6 hours. Various embodiments of the present invention thus demonstrates the following advantages:

1) Removal of adsorbates from surfaces which will be bombarded by the emission current from the emitter tip, including both the surface of the extractor facing the tip, and the surface of the emitter enclosure electrode facing the extractor.
2) Shielding of the tip volume from in-flowing gas by the emitter enclosure electrode.
3) Shielding of internal gun surfaces from BSEs emitted from the extractor.
4) The heating/bombarding filament is inside the small source volume, allowing inside surfaces to be cleaned sufficiently in a relatively short time.
5) The source is based on standard source mounting structures and can be compatible with commercial electron microscopes, such as those sold by FEI Company, Hillsboro, Oreg.

Figure 11:
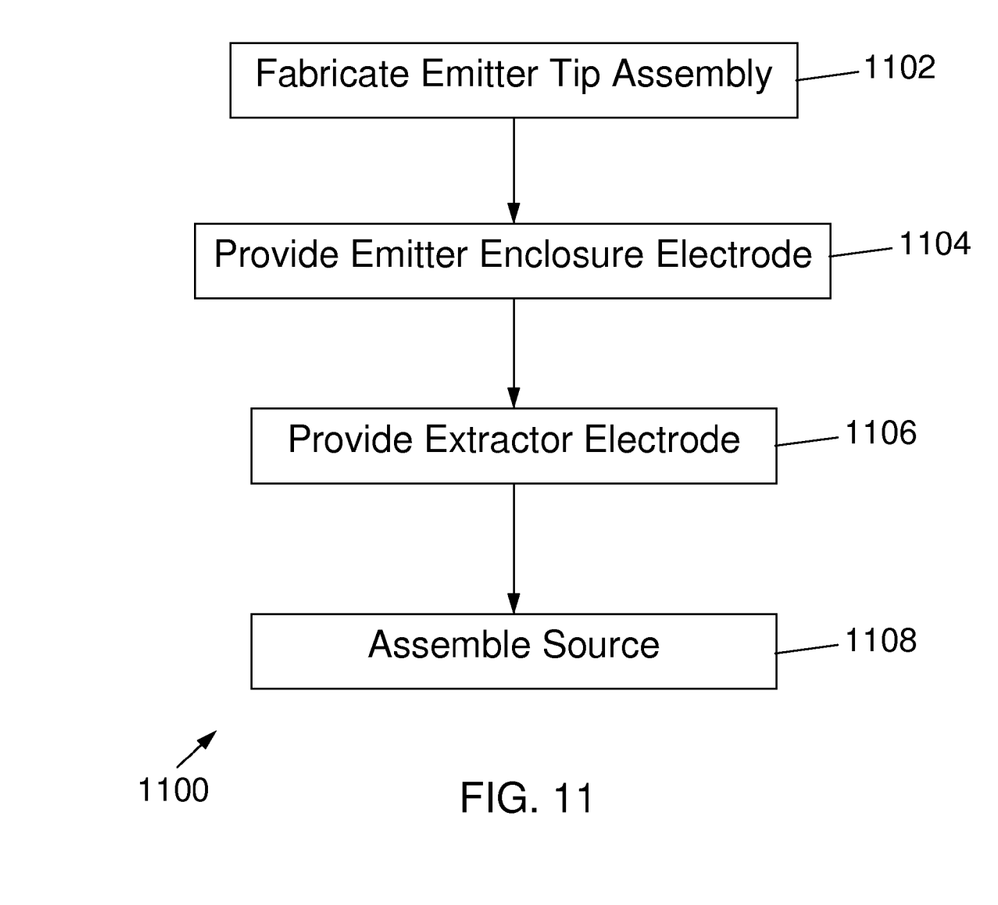
FIG. 11 is a flowchart illustrating a method for making a cold field emitter electron source of the present invention.

FIG. 11 describes a method 1100 of making a cold field emitter electron source. In step 1102, an emitter having an emitter tip and an emitter axis is provided. A method of making an emitter is described, for example, in U.S. Pat. No. 7,888,654, which is hereby incorporated by reference. In step 1104, an emitter enclosure electrode having a hole centered on the emitter axis through which the emitter extends is provided. In step 1106, an extractor electrode having a hole along the emitter axis for passage of an electron beam is provided. In optional step 1108, a filament electrode is provided between the extractor electrode and the emitter enclosure electrode, preferably the filament having an annular shape and being centered on emission axis. Step 1110 then comprises the steps necessary for assembling the cold field emitter source using the sub-assemblies and parts provided in steps 1102, 1104, 1106, and 1108. In the source assembled in step 1110, the emitter enclosure electrode and extractor electrode are optionally configured to produce a confinement space containing the emitter tip, the confinement space limiting the paths of electrons backscattered from the extraction electrode and/or reducing the flow of gas into the confinement space. This confinement space may be formed by providing an extractor electrode having a depression facing the emitter enclosure electrode.

Figure 12:
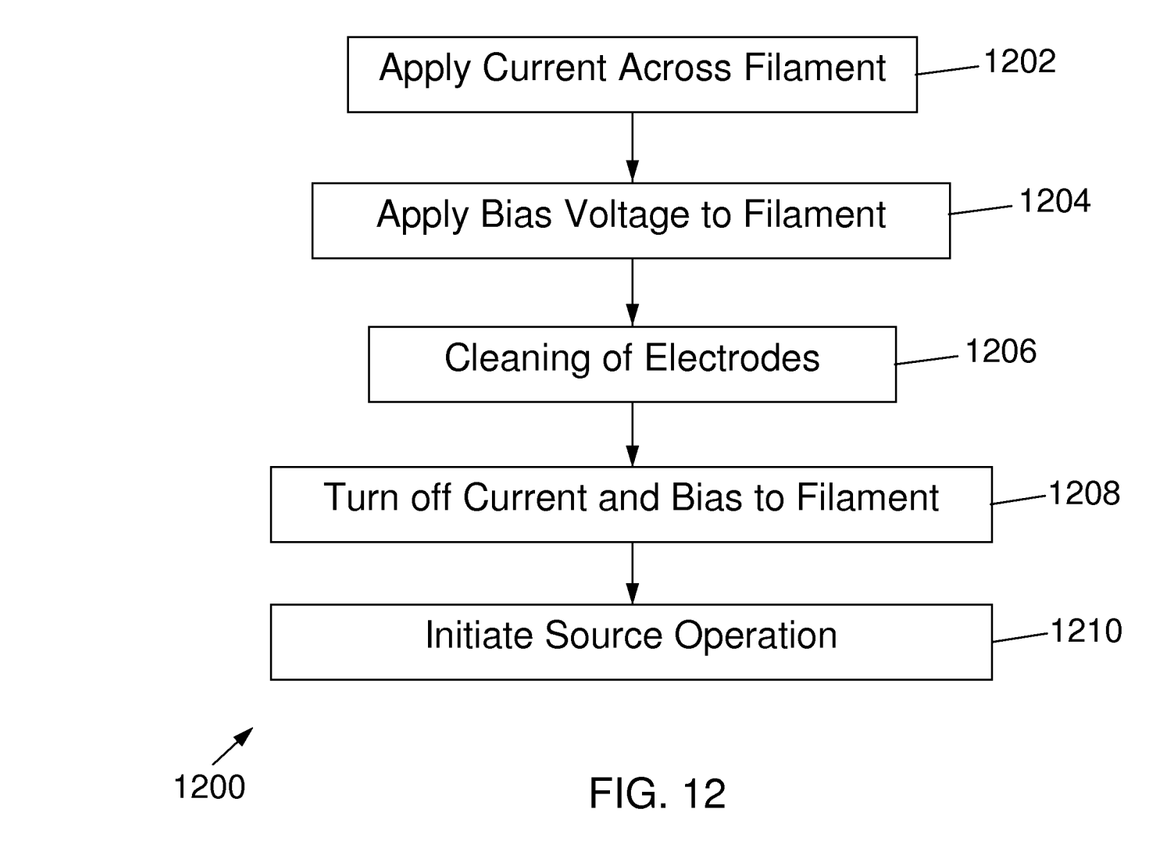
FIG. 12 is a flowchart illustrating the typical operation of an embodiment of the invention.

FIG. 12 shows a flow chart 1200 of a typical operation of an embodiment of the invention. In step 1202, the emitter tip is first flashed, and then a voltage is applied across the cleaning filament to induce a heating current through the cleaning filament to ohmically heat the cleaning filament to an elevated temperature—heating currents may typically range from 1.5 to 5.0 A. In optional step 1204, a bias voltage is applied between the cleaning filament and both the emitter enclosure electrode and the extractor electrode—typical bias voltages may range from a few V to a few kV, with the voltage on the filament being negative relative to the emitter enclosure electrode and the extractor. If step 1204 is omitted, cleaning of the electrodes in step 1206 will be solely thermal (mode 2 in FIG. 5). If step 1204 is not omitted, the combination of heating and bias voltage on the filament induces thermionic emission of electrons from the cleaning filament in step 1206 to bombard the surfaces of the emitter enclosure electrode and extractor electrode facing the emitter wire, the electron bombardment stimulating electron impact desorption of molecules from the emitter enclosure electrode and extractor electrode—this corresponds to cleaning mode 1 or 3 in FIG. 5. Note that in the case of electron impact desorption (EID) of gas off the surfaces of the emitter enclosure electrode and the extractor, a certain minimum electron bombardment energy may be necessary, typically in the range from a few eV up to a few keV. Thus, even with a certain power into the electrodes to be cleaned (calculated as the product of the filament bias voltage times the electron current), there may be inadequate desorption of gas if the bombarding electrons have insufficient energy to desorb individual gas molecules. Conversely, for thermal gas desorption, the total power imparted to the electrodes is the prime consideration for cleaning rates. Cleaning step 1206 typically lasts from a few minutes to 1-2 hours. After cleaning step 1206, the heating current and bias voltage are turned off in step 1208. In step, 1210, the emitter tip is flashed and then an extraction voltage is applied between the extractor and emitter (positive voltage on emitter) to induce cold field emission of electrons from the emitter tip towards the extraction electrode. The extraction voltage is typically between 100 V and 4000 V, more typically between 1000 V and 3000 V.

Although the present invention and its advantages have been described in detail, it should be understood that various changes, substitutions and alterations can be made to the embodiments described herein without departing from the spirit and scope of the invention as defined by the appended claims. Multiple aspects of the invention are novel and not every embodiment will require the use of every aspect. For example, the use of an emitter enclosure electrode behind the emitter tip, the use of a electrode filament between the tip and the extractor electrode, and the use of a confining space around the emitter tip and all inventive. Aspects of the invention can be applied to other types of emitters, such as Schottky emitters. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A cold field emission electron source comprising:
   an electron emitter, having a sharpened end forming an emitter tip, the axis of the emitter defining a source emission axis;
   an extractor electrode, located in front of the emitter tip, the extractor electrode having a hole approximately centered on the source emission axis;
   an emitter enclosure electrode, located behind the emitter tip, the emitter enclosure electrode having a hole approximately centered on the source emission axis, the hole diameter being larger than the diameter of the emitter wire so that the emitter tip extends past the emitter enclosure electrode, the extractor electrode and the emitter enclosure electrode forming a substantially enclosed volume defined by an inner surface of the extractor electrode and an inner surface of the emitter enclosure electrode; and
   a cleaning filament positioned within the volume for cleaning the inner surfaces of the extractor electrode and the emitter enclosure electrode.

2. The electron source of claim 1 in which the cleaning filament has an annular shape and is approximately centered on the source emission axis.

3. The electron source of claim 1, further comprising an extraction voltage supply configured to apply an extraction voltage between the emitter wire and the extraction electrode, the extraction voltage inducing cold field emission from the emitter tip towards the extraction electrode.

4. The electron source of claim 1, further comprising a filament current supply, configured to supply a current through the cleaning filament to ohmically heat the cleaning filament.

5. The electron source of claim 4, further comprising a cleaning filament biasing voltage supply, configured to apply a voltage between the cleaning filament and both the emitter enclosure electrode and the extractor electrode to induce thermionic emission of electrons from the cleaning filament to bombard the surfaces of the emitter enclosure electrode and extractor electrode facing the emitter wire, the electron bombardment stimulating electron impact desorption of molecules from the emitter enclosure electrode and extractor electrode.

6. The electron source of claim 1, in which the volume between the emitter enclosure electrode and the extractor electrode defines a gap, the width of the gap being smaller away from the emitter tip.

7. The electron source of claim 6 in which the extractor electrode comprises a depression facing the emitter tip and centered on the source emission axis, the depression being configured to largely restrict backscattered electrons generated at the extractor electrode to the volume between the emitter enclosure electrode and extractor electrode.

8. The electron source of claim 7 in which the depression is a counterbore.

9. A method of operating a cold field emitter electron source, the source including an emitter having an emitter tip, an emitter enclosure electrode, and an extractor electrode, the extractor electrode and the emitter enclosure electrode forming a substantially enclosed volume defined by an inner surface of the extractor electrode and an inner surface of the emitter enclosure electrode, the method comprising:
   heating a filament positioned within the volume between the emitter enclosure electrode and the extractor electrode to clean the inner surfaces of the extractor electrode and the emitter enclosure electrode;
   stopping the heating of the filament; and
   applying an extraction voltage to the extractor electrode to induce cold field electron emission from the cold field emitter source.

10. The method of claim 9 in which heating a filament positioned between the emitter enclosure electrode and the extractor electrode includes heating an annular filament approximately centered on the emitter.

11. The method of claim 9 in which heating a filament positioned between the emitter enclosure electrode and the extractor electrode includes heating the filament sufficiently to heat the extractor and emitter enclosure electrodes to desorb molecules adsorbed thereon.

12. The method of claim 9 further comprising applying an electrical bias between the filament and the emitter enclosure electrode and/or the extractor electrode to induce electron bombardment of the emitter enclosure electrode and/or the extractor electrode.

13. The method of claim 9 in which the volume is wider near the optical axis than at points away from the optical axis.

14. A method of making a cold field emitter electron source, the source including an emitter having an emitter tip, an emitter enclosure electrode, and an extractor electrode, the method comprising:
   providing an emitter having an emitter tip and an emitter axis;
   providing an emitter enclosure electrode having a hole on the emitter axis through which the emitter extends;
   providing an extractor electrode having a hole along the emitter axis for passage of an electron beam;
   wherein the emitter enclosure electrode and extractor electrode are configured to produce a confinement space defined by an inner surface of the emitter enclosure electrode and an inner surface of the extractor electrode containing the emitter tip, the confinement space limiting the paths of electrons backscattered from the extraction electrode and/or reducing the flow of gas into the confinement space.

15. The method of claim 14 further comprising providing a filament between the extractor electrode and the emitter enclosure electrode.

16. The method of claim 15 in which providing a filament between the extractor electrode and the emitter enclosure electrode comprises providing an annular filament centered on the emitter axis.

17. The method of claim 15 in which providing an extractor electrode having a hole along the emitter axis for passage of an electron beam includes providing an extractor electrode having a first distance from the extractor electrode to the emitter enclosure electrode at the edge of the hole and a second distance from the extractor electrode to the emitter enclosure electrode away from the hole, the second distance being shorter than the first distance to produce a confinement space.

18. The method of claim 17 in which providing an extractor electrode having a hole along the emitter axis for passage of an electron beam includes providing an extractor electrode having a countersink centered on the hole, the first distance being the distance between the bottom of the countersink and the emitter enclosure electrode and the second distance being the distance from the top of the countersink to the emitter enclosure electrode.

\* \* \* \* \*